United States Patent
Liao et al.

(10) Patent No.: US 9,678,110 B2
(45) Date of Patent: Jun. 13, 2017

(54) PROBE CARD

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chih-Chieh Liao, Taipei (TW); Yu-Min Sun, New Taipei (TW); Chih-Feng Cheng, Taoyuan (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 19 days.

(21) Appl. No.: 14/863,449

(22) Filed: Sep. 24, 2015

(65) Prior Publication Data

US 2017/0010305 A1 Jan. 12, 2017

(30) Foreign Application Priority Data

Jul. 6, 2015 (CN) .......................... 2015 1 0388747

(51) Int. Cl.
*G01R 1/44* (2006.01)
*G01R 1/073* (2006.01)

(52) U.S. Cl.
CPC .......... *G01R 1/07314* (2013.01); *G01R 1/44* (2013.01)

(58) Field of Classification Search
CPC combination set(s) only.
See application file for complete search history.

(56) References Cited

U.S. PATENT DOCUMENTS

| 5,172,050 | A | 12/1992 | Swapp |
| 5,555,422 | A | 9/1996 | Nakano |
| 7,642,794 | B2 | 1/2010 | Eldridge et al. |
| 8,736,294 | B2 | 5/2014 | Chang |
| 2003/0098702 | A1* | 5/2003 | Tatematsu .......... G01R 31/2891 324/754.03 |
| 2010/0201390 | A1* | 8/2010 | Takahaski .......... G01R 1/07342 324/756.03 |

* cited by examiner

*Primary Examiner* — Clayton E Laballe
*Assistant Examiner* — Jas Sanghera
(74) *Attorney, Agent, or Firm* — CKC & Partners Co., Ltd.

(57) ABSTRACT

A probe card includes a circuit board, a plurality of probes, and at least one deviation-compensating member. An end of each of the probes is connected to the circuit board. The deviation-compensating member is fixed to the circuit board and connected to the probes. The probes have a first thermal expansion characteristic, the deviation-compensating member has a second thermal expansion characteristic, and the first thermal expansion characteristic and the second thermal expansion characteristic are different.

10 Claims, 2 Drawing Sheets

PROBE CARD

RELATED APPLICATIONS

This application claims priority to China Application Serial Number 201510388747.3, filed Jul. 6, 2015, which is herein incorporated by reference.

BACKGROUND

Technical Field

The present disclosure relates to a probe card.

Description of Related Art

The main purpose of a probe card is to achieve automated measurement by directly contacting the probes to the pads or bumps on the DUTs (Device Under Test, such as a chip) and coordinating with peripheral testing machines and software controlling. Therefore, the electrical characteristics and performances of the DUTs can be ensured to comply with the design specifications, and defective products can be effectively screened. The actual testing procedures generally are transmitting testing signals from the testing machines to the DUTs through the probe card, and returning the testing results from the DUTs to the testing machines through the probe card to be further analyzed.

The probe card has precise contacting mechanisms for performing electrical tests to the circuits on the DUTs, and the precise contacting mechanisms are probes. In general, the high temperature setting of circuit probing test is usually more than 80° C., and the chuck emits thermal radiation, which therefore affects metal behavior in the space near the chuck. For example, the lengths of the affected probes will increase, so as to affect the three-dimensional positions of the needle tips.

However, the thermal stream of the thermal radiation is actually dynamic, so the probes may face different thermal energy impacts, which results in that the three-dimensional positions of the needle tips cannot be determined and further causes a large difference between probe marks respectively at room temperature and a high temperature. The above situations become serious especially to the probe cards having large probing areas, such as multi-DUT probe cards. When the location of the probe mark is not precise, some probes may not precisely contact the pads or bumps on the DUT when testing, which will seriously affect the electrical detection functions of the probe card. Because the foregoing deviation problem of offset of the probe marks occurs frequently, it tends to increase the length of debugging time and setting multi-DUT probe markings.

SUMMARY

Accordingly, an aspect of the disclosure is to provide a probe card to solve the above-mentioned problems.

The disclosure provides a probe card used in a probe card. The probe card includes a circuit board, a plurality of probes, and at least one deviation-compensating member. An end of each of the probes is connected to the circuit board. The deviation-compensating member is fixed to the circuit board and connected to the probes. The probes have a first thermal expansion characteristic, the deviation-compensating member has a second thermal expansion characteristic, and the first thermal expansion characteristic and the second thermal expansion characteristic are different.

In an embodiment of the disclosure, the first thermal expansion characteristic is thermal expansion/cool' contraction, and the second thermal expansion characteristic is thermal contraction/cool expansion.

In an embodiment of the disclosure, a material of the deviation-compensating member includes bismuth (Bi), antimony (Sb), gallium (Ga), zirconium tungstate ($ZrW_2O_8$), $Li_2O$—$Al_2O_3$-$nSiO_2$, and bronze.

In an embodiment of the disclosure, the first thermal expansion characteristic is thermal contraction/cool expansion, and the second thermal expansion characteristic is thermal expansion/cool contraction.

In an embodiment of the disclosure, a material of the probes includes bismuth, antimony, gallium, zirconium tungstate, $Li_2O$—$Al_2O_3$-$nSiO_2$, and bronze.

In an embodiment of the disclosure, each of the probes has a needle tip, a needle body, and a needle tail sequentially connected. The needle tail is connected to the circuit board. The deviation-compensating member is connected to the needle body.

In an embodiment of the disclosure, the probe card further includes an insulating base and an adhesive member. The insulating base is fixed to the circuit board and connected to the deviation-compensating member. The deviation-compensating member is connected to the probes through the adhesive member.

In an embodiment of the disclosure, a material of the insulating base includes a ceramic material and a material of the adhesive member includes epoxy.

In an embodiment of the disclosure, the adhesive member has at least one through hole communicated with the deviation-compensating member.

In an embodiment of the disclosure, the probe card further includes a plurality of the deviation-compensating members and a plurality of the through holes. The through holes divide the adhesive member into a plurality of adhesive portions. Each of the deviation-compensating members is connected to the corresponding probe through the corresponding adhesive portion.

Accordingly, the probe card of the disclosure has an automatic calibration mechanism for reducing the needle tip offset. Specifically, the probe card of the disclosure utilizes the deviation-compensating member of which the thermal expansion characteristic is different from the thermal expansion characteristic of the probes to compensate and reduce the deviation problem of offset of the needle tips generated by impacts of high temperature tests. Therefore, the locations of the probe marks of the probes at high temperatures will be as accurate as the locations of the probe marks of the probes at room temperature. Moreover, the probe card of the disclosure can reduce the number and frequency of the production abnormality and improve debugging. In addition, even detecting multi-DUTs, the probe card of the disclosure is effortlessly setup without compromising with the locations of the multi-DUTs.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
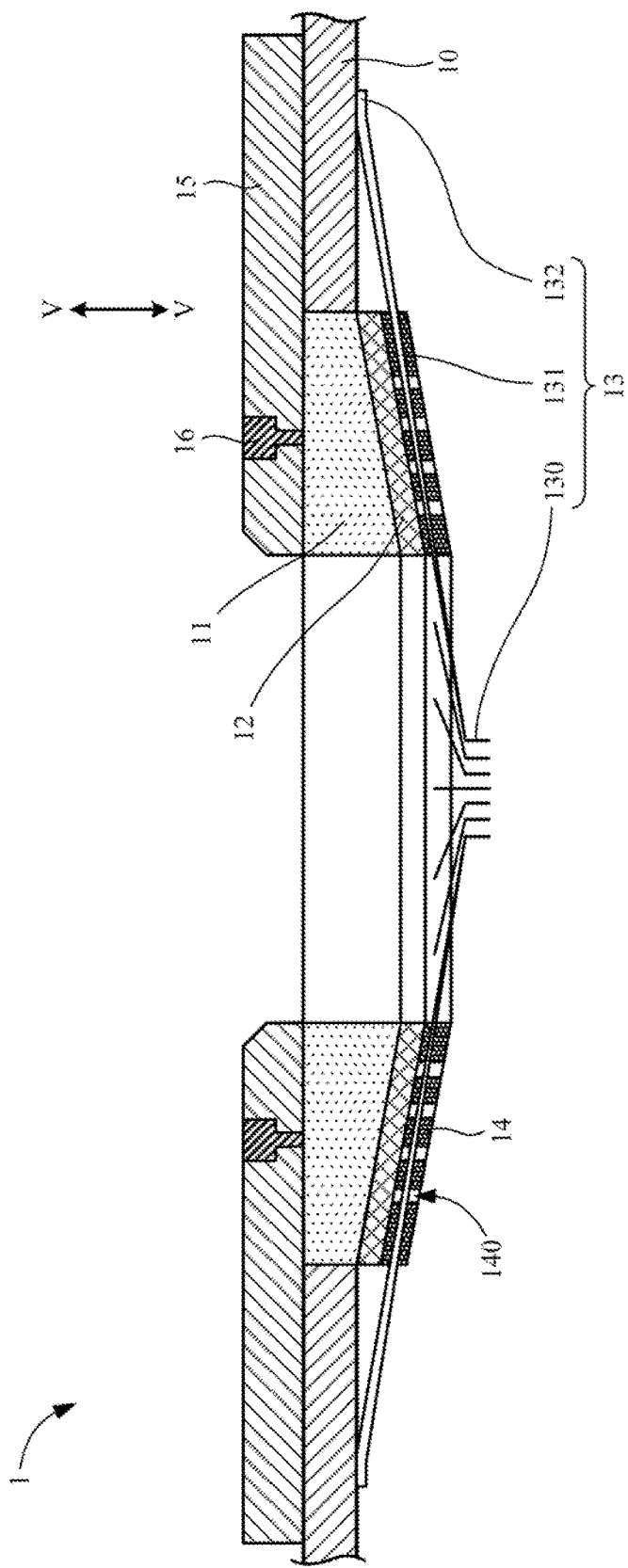
FIG. 1 is a side cross-sectional view of a probe card according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a side cross-sectional view of a probe card 1 according to an embodiment of the disclosure. The probe card 1 shown in FIG. 1 is a probe card for testing CISs (CMOS Image Sensors) as an example, which has an aperture at the center for light to pass through. However, the disclosure is not limited in this regard, and various kinds of probe cards can utilize the core concepts of the disclosure.

As shown in FIG. 1, in the embodiment, the probe card 1 includes a circuit board 10, an insulating base 11, a plurality of probes 13, and at least one deviation-compensating member 12. An end of each of the probes 13 is connected to the circuit board 10. In more detail, each of the probes 13 has a needle tip 130, a needle body 131, and a needle tail 132 sequentially connected, and the needle tail 132 is connected to the circuit board (e.g., by welding). The insulating base 11 is fixed to the circuit board 10 and connected to the deviation-compensating member 12. Specifically, the insulating base 11 and the circuit board 10 are individually fixed to a stiffener 15 (see FIG. 1), so as to fix each other. The detailed fixing approaches among the insulating base 11, the circuit board 10, and the stiffener 15 are introduced below.

In some embodiments, a material of the insulating base 11 includes a ceramic material, so the thermal expansion coefficient of the insulating base 11 is very small. Therefore, when the probe card 1 is tested under a high temperature environment, the affect that the insulating base 11 causes to the deviations of offset occurred among the needle tips 130 of the probes 13 is very little. However, the disclosure is not limited in this regard. Other similar materials that can achieve the same function and purpose can be applied to the insulating base 11 of the disclosure.

Particularly, the probes 13 have a first thermal expansion characteristic, the deviation-compensating member 12 has a second thermal expansion characteristic, and the first thermal expansion characteristic and the second thermal expansion characteristic are different. Based on the thermal expansion coefficient of the deviation-compensating member 12, the deviations of offset among the needle tips 130 of the probes 13 at high temperatures can be effectively compensated by adequately adjusting the thickness of the deviation-compensating member 12. Specifically, in an embodiment, the first thermal expansion characteristic of the probes 13 is thermal expansion/cool contraction (i.e., the thermal expansion coefficient is positive), and the second thermal expansion characteristic of the deviation-compensating member 12 is thermal contraction/cool expansion (i.e., the thermal expansion coefficient is negative). For example, under a high temperature environment, when a probe 13 is lengthened due to thermal expansion phenomenon, the needle tip 130 of the probe 13 may downwardly generate a displacement component of 20 um in the direction perpendicular to the circuit board 10 (i.e., the vertical direction V in FIG. 1). By adequately adjusting the thickness of the deviation-compensating member 12, the deviation-compensating member 12 can pull the needle body 131 of the probe 13 to swing upwards due to thermal contraction phenomenon, so as to make the needle tip 130 upwardly generate a displacement component of 20 um in the foregoing direction. Finally, the deviation-compensating member 12 can make the ideal offset of the needle tips 130 in the direction perpendicular to the circuit board 10 be zero or almost zero.

In some embodiments, in order to test multi-DUTs, the number of the probes 13 included in the probe card 1 may be more than two thousand. With the compensation provided by the deviation-compensating member 12, even though exterior thermal stream is irregular, dynamic, and timely variable, the coplanarity of the probes 13 can be optimized and maintained even at room temperature or high temperatures.

In some embodiments, a material of the deviation-compensating member 12 can be, but is not limited to, bismuth (Bi), antimony (Sb), gallium (Ga), zirconium tungstate ($ZrW_2O_8$), $Li_2O$—$Al_2O_3$-$nSiO_2$, or bronze, or a combination of at least one of the foregoing materials.

In another embodiment, the first thermal expansion characteristic of the probes 13 is thermal contraction/cool expansion (i.e., the thermal expansion coefficient is negative), and the second thermal expansion characteristic of the deviation-compensating member 12 is thermal expansion/cool contraction (i.e., the thermal expansion coefficient is positive). Therefore, under a high temperature environment, when a probe 13 is shortened due to thermal contraction phenomenon, the needle tip 130 of the probe 13 may upwardly generate a displacement component of 20 um in the direction perpendicular to the circuit board 10 (i.e., the vertical direction V in FIG. 1). By adequately adjusting the thickness of the deviation-compensating member 12, the deviation-compensating member 12 can push the needle body 131 of the probe 13 to swing downwards due to thermal expansion phenomenon, so as to make the needle tip 130 downwardly generate a displacement component of 20 um in the foregoing direction. Finally, the deviation-compensating member 12 can similarly make the ideal offset of the needle tips 130 in the direction perpendicular to the circuit board 10 be zero or almost zero.

In some embodiments, a material of the probes can be, but is not limited to, bismuth, antimony, gallium, zirconium tungstate, $Li_2O$—$Al_2O_3$-$nSiO_2$, or bronze, or a combination of at least one of the foregoing materials.

As shown in FIG. 1, in the embodiment, the probe card 1 further includes an adhesive member 14. The deviation-compensating member 12 is connected to the probes 13 through the adhesive member 14. The adhesive member 14 has a plurality through holes 140. Each of the through holes 140 dodges the probes 13 to be communicated with the deviation-compensating member 12. By forming the through holes 140 communicated with the deviation-compensating member 12 on the adhesive member 14, the thermal radiation from the external environment can be rapidly transmitted to the deviation-compensating member 12 no matter whether the probe card 1 performs the testing procedures at room temperature or high temperatures, so that the expansion phenomenon and the contraction phenomenon of the deviation-compensating member 12 and the probes 13 can occur simultaneously to achieve the compensating effect.

In some embodiments, a material of the adhesive member 14 includes epoxy, but the disclosure is not limited in this regard.

As shown in FIG. 1, in the embodiment, the probe card 1 further includes the stiffener 15 and fasteners 16. The stiffener 15 is disposed at a side of the circuit board 10 and the insulating base 11 facing away from the probes 13. The fasteners 16 pass through the stiffener 15 and are fastened to the insulating base 11, so as to fix the stiffener 15 to the insulating base 11 and make the circuit board 10 abut against the stiffener 15. Therefore, the stiffener 15 can improve the whole structural strength of the probe card 1 and prevent the circuit board 10 from damage when the probe card 1 presses downwards onto the DUTs.

Figure 2:
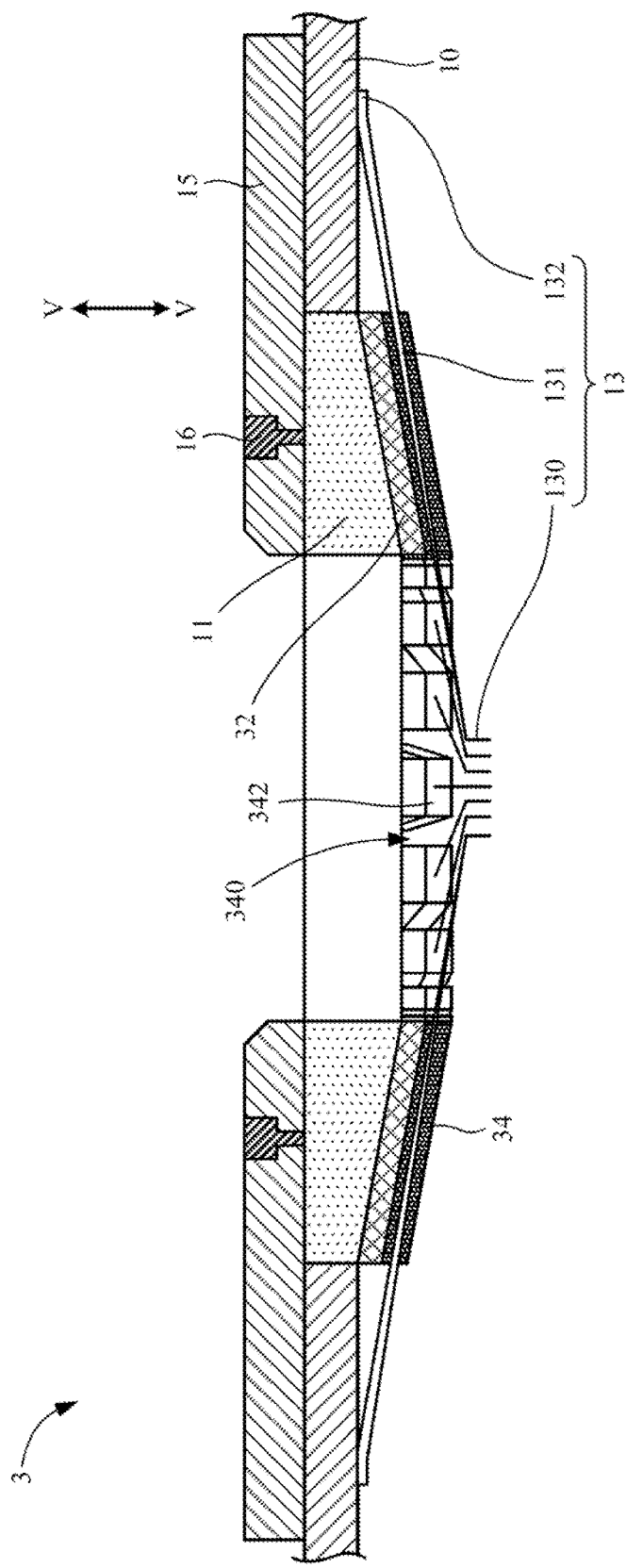
FIG. 2 is a side cross-sectional view of a probe card according to another embodiment of the disclosure.

FIG. 2 is a side cross-sectional view of a probe card 3 according to another embodiment of the disclosure. As shown in the figure, in the embodiment, the probe card 3 similarly includes a circuit board 10, an insulating base 11, a plurality of probes 13, a deviation-compensating member 32, an adhesive member 34, a stiffener 15, and fasteners 16, in which the structures and functions of the circuit board 10, the insulating base 11, the probes 13, the stiffener 15, and fasteners 16 and the connection relationships among the foregoing components can be referred to the embodiment shown in FIG. 1 the related descriptions above. It should be pointed out that the differences between the probe card 3 of the present embodiment and the probe card 1 of the embodiment shown in FIG. 1 are that the probe card 3 of the present embodiment further includes a plurality of the deviation-compensating members 32, the through holes 340 of the adhesive member 34 divide the adhesive member 34 into a plurality of adhesive portions 342, and each of the deviation-compensating members 32 is connected to the corresponding probe 13 through the corresponding adhesive portion 342. In other words, each of the through holes 340 of the adhesive member 34 is aligned with the gap between two adjacent deviation-compensating members 32.

With the foregoing structural configurations, under the affect of the exterior thermal stream that is irregular, dynamic, and timely variable, each of the deviation-compensating members 32 can compensate the offset of the needle tip 130 of the corresponding probe 13 in the direction perpendicular to the circuit board 10 more precisely. That is, the offset of the needle tip 130 of each of the probes 13 can be independently compensated by the corresponding deviation-compensating member 32, and any two adjacent probes 13 will not affect each other during expansion or contraction, so do the corresponding deviation-compensating members 32.

According to the foregoing recitations of the embodiments of the disclosure, it can be seen that the probe card of the disclosure has an automatic calibration mechanism for reducing the needle tip offset. Specifically, the probe card of the disclosure utilizes the deviation-compensating member of which the thermal expansion characteristic is different from the thermal expansion characteristic of the probes to compensate and reduce the deviation problem of offset of the needle tips generated by impacts of high temperature tests. Therefore, the locations of the probe marks of the probes at high temperatures will be as accurate as the locations of the probe marks of the probes at room temperature. Moreover, the probe card of the disclosure can reduce the number and frequency of the production abnormality and debugging. In addition, even detecting multi-DUTs, the probe card of the disclosure is effortlessly setup without compromising with the locations of the multi-DUTs.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A probe card, comprising:
    a circuit board;
    a plurality of probes, wherein an end of each of the probes is connected to the circuit board;
    at least one deviation-compensating member fixed to the circuit board and connected to the probes,
    wherein the probes have a first thermal expansion characteristic, the deviation-compensating member has a second thermal expansion characteristic, and the first thermal expansion characteristic and the second thermal expansion characteristic are inverse.

2. The probe card of claim 1, wherein the first thermal expansion characteristic is thermal expansion/cool contraction, and the second thermal expansion characteristic is thermal contraction/cool expansion.

3. The probe card of claim 2, wherein a material of the deviation-compensating member comprises bismuth (Bi), antimony (Sb), gallium (Ga), zirconium tungstate ($ZrW_2O_8$), $Li_2O$—$Al_2O_3$-$nSiO_2$, and bronze.

4. The probe card of claim 1, wherein the first thermal expansion characteristic is thermal contraction/cool expansion, and the second thermal expansion characteristic is thermal expansion/cool contraction.

5. The probe card of claim 4, wherein a material of the probes comprises bismuth, antimony, gallium, zirconium tungstate, $Li_2O$—$Al_2O_3$-$nSiO_2$, and bronze.

6. The probe card of claim 1, wherein each of the probes has a needle tip, a needle body, and a needle tail sequentially connected, the needle tail is connected to the circuit board, and the deviation-compensating member is connected to the needle body.

7. The probe card of claim 1, further comprising:
    an insulating base fixed to the circuit board and connected to the deviation-compensating member; and
    an adhesive member, wherein the deviation-compensating member is connected to the probes through the adhesive member.

8. The probe card of claim 7, wherein a material of the insulating base comprises a ceramic material, and a material of the adhesive member comprises epoxy.

9. The probe card of claim 7, wherein the adhesive member has at least one through hole communicated with the deviation-compensating member.

10. The probe card of claim 9, further comprising a plurality of the deviation-compensating members and a plurality of the through holes, wherein the through holes divide the adhesive member into a plurality of adhesive portions, and each of the deviation-compensating members is connected to the corresponding probe through the corresponding adhesive portion.

* * * * *